US012765437B2

(12) United States Patent
Huang et al.
(10) Patent No.: US 12,765,437 B2
(45) Date of Patent: Oct. 13, 2026

(54) SEMICONDUCTOR DEVICE AND MANUFACTURING METHOD THEREOF

(71) Applicant: MEDIATEK Inc., Hsinchu City (TW)

(72) Inventors: Pu-Shan Huang, Hsinchu City (TW); Chi-Yuan Chen, Hsinchu City (TW); Shih-Chin Lin, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 451 days.

(21) Appl. No.: 18/475,318

(22) Filed: Sep. 27, 2023

(65) Prior Publication Data

US 2024/0145350 A1 May 2, 2024

Related U.S. Application Data

(60) Provisional application No. 63/381,575, filed on Oct. 31, 2022.

(51) Int. Cl.

*H10W 90/00* (2026.01)
*H10W 70/40* (2026.01)
*H10W 72/50* (2026.01)
*H10W 74/10* (2026.01)

(52) U.S. Cl.

CPC ........ *H10W 90/811* (2026.01); *H10W 70/415* (2026.01); *H10W 70/468* (2026.01); *H10W 72/50* (2026.01); *H10W 70/417* (2026.01); *H10W 74/111* (2026.01); *H10W 90/701* (2026.01)

(58) Field of Classification Search

CPC ... H01L 23/49575; H01L 24/48; H01L 24/49; H01L 23/4951; H01L 23/49531; H10W 90/811; H10W 70/415; H10W 70/468; H10W 72/50

See application file for complete search history.

(56) References Cited

U.S. PATENT DOCUMENTS 10,147,697 B1 * 12/2018 Hegde ..................... H01L 24/48
2008/0099896 A1 * 5/2008 Shen ................. H01L 23/49575 257/676
2008/0128876 A1 * 6/2008 Liu ..................... H01L 23/4951 257/676
2008/0157304 A1 * 7/2008 Chiou ............... H01L 23/49531 257/676
2014/0269805 A1 * 9/2014 Lai ........................ H01S 5/0267 372/50.23
2019/0080991 A1 * 3/2019 Vincent ............. H01L 23/49575

* cited by examiner

*Primary Examiner* — Peter M Albrecht
(74) *Attorney, Agent, or Firm* — McClure, Qualey & Rodack, LLP

(57) ABSTRACT

A semiconductor device is provided. The semiconductor device includes a carrier, an electronic component, an adapter, a first metal wire and a second metal wire. The electronic component is disposed on the carrier. The adapter is disposed on the carrier. The first metal wire connects the electronic component and the adapter. The second metal wire connects the adapter and the carrier.

18 Claims, 6 Drawing Sheets

SEMICONDUCTOR DEVICE AND MANUFACTURING METHOD THEREOF

This application claims the benefit of U.S. Provisional application Ser. No. 63/381,575, filed Oct. 31, 2022, the disclosure of which is incorporated by reference herein in its entirety.

FIELD OF THE INVENTION

The invention relates to a semiconductor device and a manufacturing method thereof, and more particularly to a semiconductor device including an adapter disposed on a carrier and a manufacturing method thereof.

BACKGROUND OF THE INVENTION

Conventional semiconductor device includes a large number of metal wires connecting an electronic with a carrier. The more the number of the metal wires is, the greater the density of the metal wires. However, greater density is easy to cause electric shorting of the metal wires. Thus, how to resolve the problem has become a prominent task for the industries.

SUMMARY OF THE INVENTION

In an embodiment of the invention, a semiconductor device is provided. The semiconductor device includes a carrier, an electronic component, an adapter, a first metal wire and a second metal wire. The electronic component is disposed on the carrier. The adapter is disposed on the carrier. The first metal wire connects the electronic component and the adapter. The second metal wire connects the adapter and the carrier.

In another embodiment of the invention, a semiconductor method is provided. The manufacturing method includes the following steps: disposing an electronic component on a carrier; disposing an adapter on the carrier; connecting the electronic component and the adapter by a first metal wire; connecting the adapter and the carrier by a second metal wire.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1A:
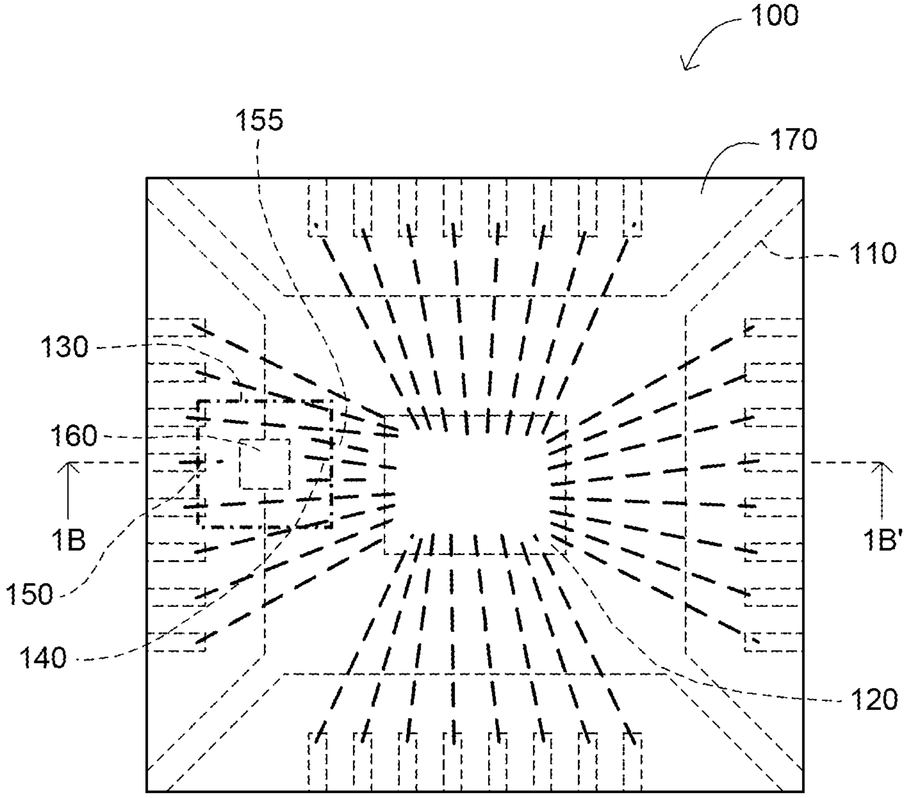
FIG. 1A illustrates a diagram view of a top view of a semiconductor device according to an embodiment of the invention.
Figure 1B:
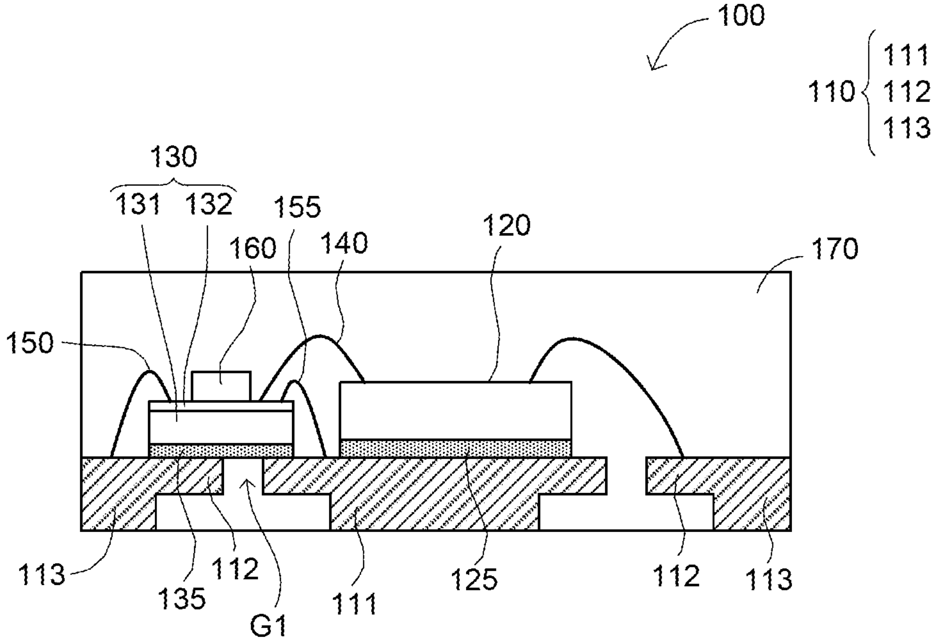
FIG. 1B illustrates a cross-sectional views of the semiconductor device of FIG. 1A along a direction 1B-1B'.

Referring to FIGS. 1A to 1B, FIG. 1A illustrates a diagram view of a top view of a semiconductor device 100 according to an embodiment of the invention, and FIG. 1B illustrates a cross-sectional views of the semiconductor device 100 of FIG. 1A along a direction 1B-1B'.

The semiconductor device 100 could be applied to an electronic product, such as a home appliance (for example, television), a wireless communication device supporting, for example, Wi-Fi, RF, etc.

The semiconductor device 100 includes a carrier 110, at least one an electronic component 120, a first adhesive layer 125, at least one adapter 130, a second adhesive layer 135, at least one first metal wire 140, at least one second metal wire 150, at least one third metal wire 155, at least one passive element 160 and a package body 170.

As illustrated in FIG. 1B, the electronic component 120 is disposed on the carrier 110. The adapter 130 is disposed on the carrier 110. At least one first metal wire 140 connects the electronic component 120 and the adapter 130. At least one second metal wire 150 connects the adapter 130 and the carrier 110. Compared with a semiconductor device without the adapter 130, a length of the first metal wire 140 and a length of the second metal wire 150 of the semiconductor device 100 could be shorter and a wire density on the carrier 110 could be reduced (an interval between two metal wires could be increased). As a result, it could avoid the electrical shorting of the metal wires in wire bonding process and/or the process of forming the package body 170.

As illustrated in FIG. 1B, in the present embodiment, the carrier 110 is, for example, a leadframe. The carrier 110 includes a die pad 111 and at least one lead separated from the die pad 111 by a gap G1, wherein each lead includes an inner lead 112 and an outer lead 113 connecting the inner lead 112.

As illustrated in FIG. 1B, the electronic component 120 is disposed on the die pad 111. The electronic component 120 is, for example, a die, a chip, a semiconductor package, etc. In an embodiment, the electronic component 120 is, for example, SoC (System on a Chip), etc.

The first adhesive layer 125 is disposed between the electronic component 120 and the carrier 110 for fixing the relative position between the electronic component 120 and the carrier 110. The first adhesive layer 125 is an electrical insulation.

As illustrated in FIG. 1B, the adapter 130 bridges the die pad 111 and at least one lead, for example, the inner lead 112 of the lead. In an embodiment, the adapter 130 includes a silicon substrate 131 and a RDL (Redistribution layer) 132 formed on the silicon substrate 131. The first metal wire 140 and the second metal wire 150 are electrically connected to the RDL 132 of the adapter 130. In another embodiment, the adapter 130 is, for example, a printed circuit board (PCB), an interposer, another semiconductor device or a semiconductor package. In addition, the adapter 130 is a component with pure electrical transmission. That is, the adapter 130 is a component without any circuit function, such as any active element and any passive element.

As illustrated in FIG. 1B, the second adhesive layer 135 is disposed between the adapter 130 and the carrier 110 for fixing the relative position between the adapter 130 and the carrier 110. The second adhesive layer 135 is an electrical insulation.

As illustrated in FIG. 1B, the first metal wire 140 could stride the third metal wire 155. The first metal wire 140 connects the electronic component 120 with the adapter 130, for example, the RDL 132 of the adapter 130.

In addition, the metal wire may be formed of, for example, copper, etc., and the metal wire may be formed on the lead through, for example, solder paste.

As illustrated in FIG. 1B, the second metal wire 150 connects the adapter 130 and the lead, for example, the outer lead 113 of the lead.

As illustrated in FIG. 1B, at least one third metal wire 155 connects carrier 110 and the adapter 130. For example, the third metal wire 155 connects the die pad 111 of the carrier 110 and the RDL 132 of the adapter 130.

As illustrated in FIG. 1B, the passive element 160 is a resistor, a capacitor or an inductor. The passive element 160 could be disposed on or over the adapter 130 and electrically connected to the RDL 132 of the adapter 130. The passive element 160 could be electrically connected to the electronic component 120 through at least one first metal wire 140.

As illustrated in FIG. 1B, the package body 170 encapsulates the electronic component 120, the adapter 130, the first metal wires 140, the second metal wires 150 and the carrier 110. The package body 170 exposes the outer leads 113 for electrically connecting an external electronic component.

As illustrated in FIG. 1B, the package body 170 is, for example, a molding compound. The molding material could include, for example, a Novolac-based resin, an epoxy-based resin, a silicone-based resin, or another suitable encapsulant. Suitable fillers also can be included, such as powdered SiO2. The molding material could be applied using any of a number of molding techniques, such as compression molding, injection molding, or transfer molding.

Figure 2A:
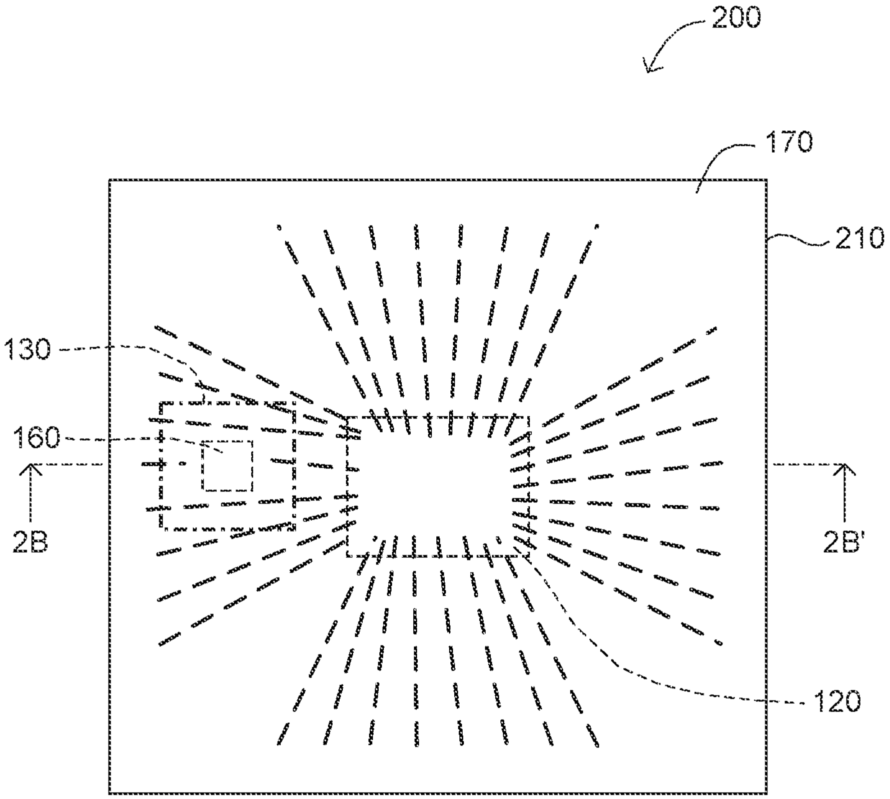
FIG. 2A illustrates a diagram view of a top view of a semiconductor device according to an embodiment of the invention.
Figure 2B:
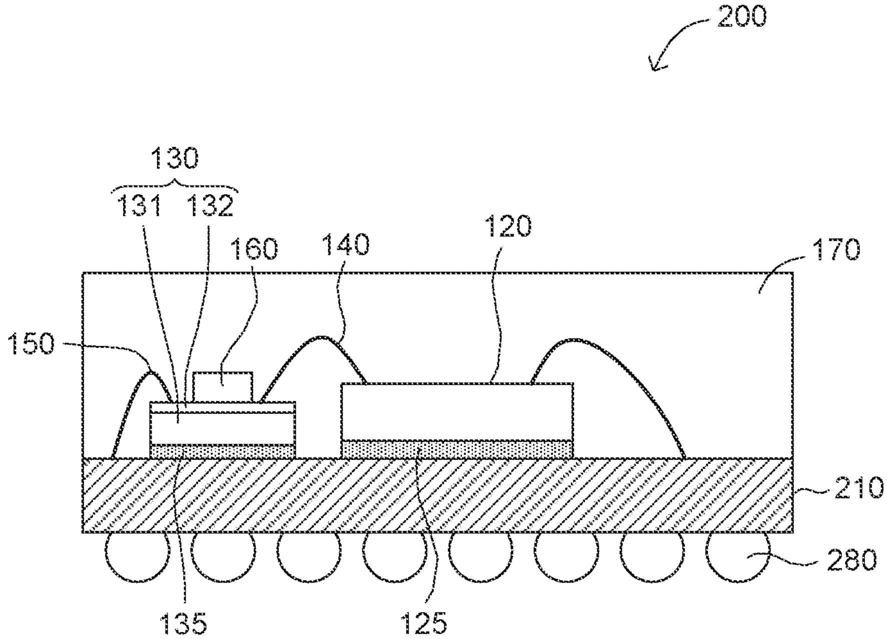
FIG. 2B illustrates a cross-sectional views of the semiconductor device of FIG. 2A along a direction 2B-2B'.

Referring to FIGS. 2A to 2B, FIG. 2A illustrates a diagram view of a top view of a semiconductor device 200 according to an embodiment of the invention, and FIG. 2B illustrates a cross-sectional views of the semiconductor device 200 of FIG. 2A along a direction 2B-2B'.

The semiconductor device 200 could be applied to an electronic product, such as a home appliance (for example, television), a wireless communication device supporting, for example, Wi-Fi, RF, etc.

As illustrated in FIG. 2B, the semiconductor device 200 includes a carrier 210, at least one an electronic component 120, the first adhesive layer 125, at least one adapter 130, the second adhesive layer 135, at least one first metal wire 140, at least one second metal wire 150, at least one passive element 160, the package body 170 and at least one solder ball 280.

The semiconductor device 200 is, for example, a Flip Chip Ball Grid Array (FCBGA), such as a High Performance FCBGA; however, such exemplification is not meant to be for limiting. Furthermore, the solder balls 280 are formed on a lower surface of the substrate 210 for electrically connecting an external electronic component. The electronic component 120 could be electrically connected to the external electronic component through the solder balls 280.

As illustrated in FIG. 2B, the electronic component 120 is disposed on the carrier 210. The adapter 130 is disposed on the carrier 210. At least one first metal wire 140 connects the electronic component 120 and the adapter 130. At least one second metal wire 150 connects the adapter 130 and the carrier 210. Compared with a semiconductor device without the adapter 130, a length of the first metal wire 140 and a length of the second metal wire 150 of the semiconductor device 200 could be shorter and wire density on the carrier 210 could be reduced (an interval between two metal wires could be increased). As a result, it could avoid the electrical shorting of the metal wires in wire bonding process and/or the process of forming the package body 170.

As illustrated in FIG. 2B, the semiconductor device 200 includes the features the same as or similar to that of the semiconductor device 100, and the difference is that the carrier 210 includes different structure.

In the present embodiment, the carrier 210 is a substrate, a PCB, for example. The carrier 210 may be a single-layered carrier or a multi-layered carrier. In an embodiment, the carrier 210 includes substrate core materials, including ceramic based materials such as alumina. Other types of materials, such as mold compounds or organic materials, including polyamide, Bismaleimide Triazine (BT) resin or FR-4 or FR-5 materials, may also be useful. The material of the structural member, for example, could be selected to balance CTE of the components of the package.

Figure 3A:
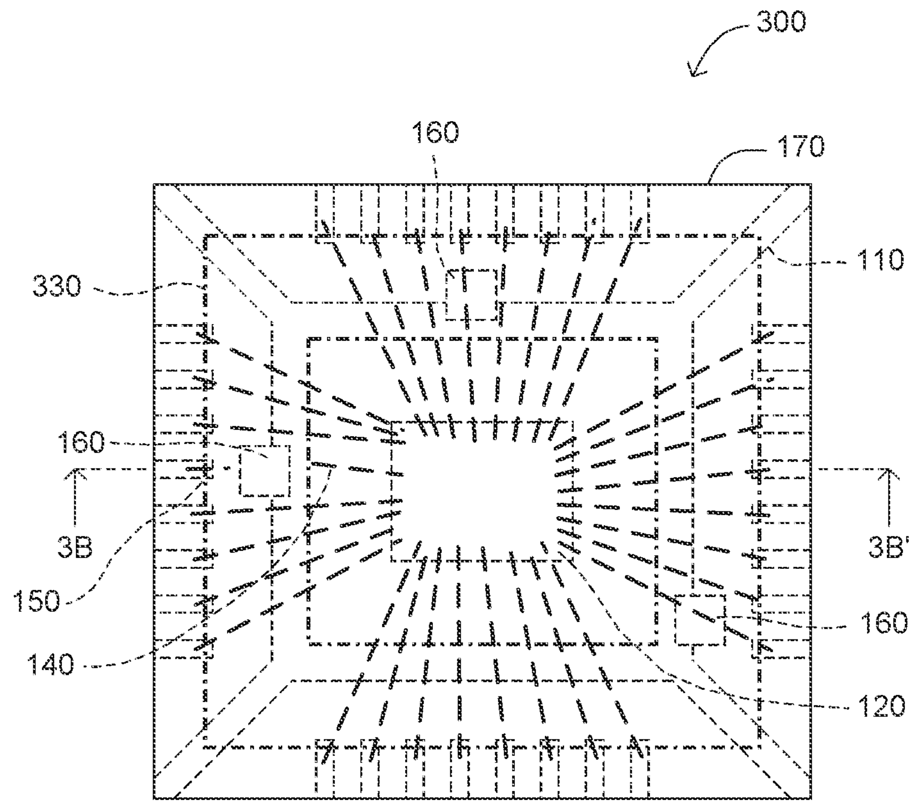
FIG. 3A illustrates a diagram view of a top view of a semiconductor device according to an embodiment of the invention.
Figure 3B:
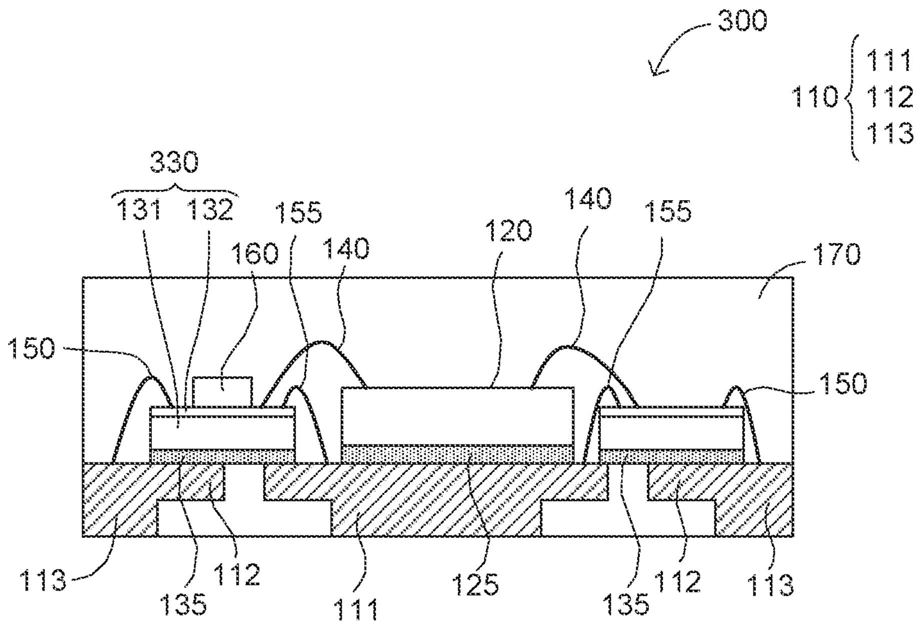
FIG. 3B illustrates a cross-sectional views of the semiconductor device of FIG. 3A along a direction 3B-3B'.

Referring to FIGS. 3A to 3B, FIG. 3A illustrates a diagram view of a top view of a semiconductor device 300 according to an embodiment of the invention, and FIG. 3B illustrates a cross-sectional views of the semiconductor device 300 of FIG. 3A along a direction 3B-3B'.

As illustrated in FIG. 3B, the semiconductor device 300 could be applied to an electronic product, such as a home appliance (for example, television), a wireless communication device supporting, for example, Wi-Fi, RF, etc.

As illustrated in FIG. 3B, the semiconductor device 300 includes the carrier 110, at least one an electronic component 120, the first adhesive layer 125, at least one adapter 330, the second adhesive layer 135, at least one first metal wire 140, at least one second metal wire 150, at least one third metal wire 155, at least one passive element 160 and the package body 170.

As illustrated in FIG. 3B, the electronic component 120 is disposed on the carrier 110. The adapter 330 is disposed on the carrier 110. At least one first metal wire 140 connects the electronic component 120 and the adapter 330. At least one second metal wire 150 connects the adapter 330 and the carrier 110. Compared with a semiconductor device without the adapter 330, a length of the first metal wire 140 and a length of the second metal wire 150 of the semiconductor device 300 could be shorter and wire density on the carrier 310 could be reduced (an interval between two metal wires could be increased). As a result, it could avoid the electrical shorting in wire bonding process and/or the process of forming the package body 170.

As illustrated in FIG. 3B, the semiconductor device 300 includes the features the same as or similar to that of the semiconductor device 100, and the difference is that the adapter 330 includes different structure, for example, a shape in top-view.

As illustrated in FIG. 3B, the adapter 330 is a ring structure which surrounds the electronic component 120. The adapter 330 is an open-ring structure or a close-ring structure.

Figure 4A:
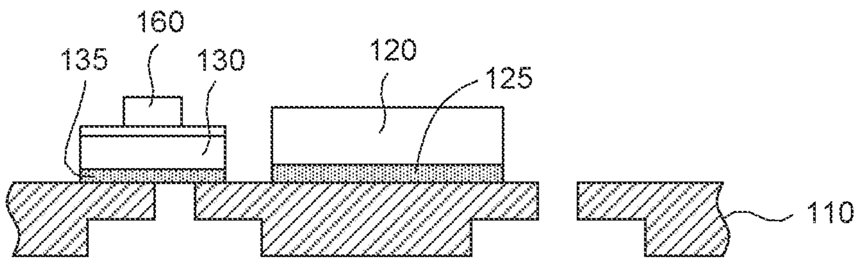
FIGS. 4A to 4C illustrate diagram views of manufacturing processes of the semiconductor device of FIG. 1B.
Figure 4B:
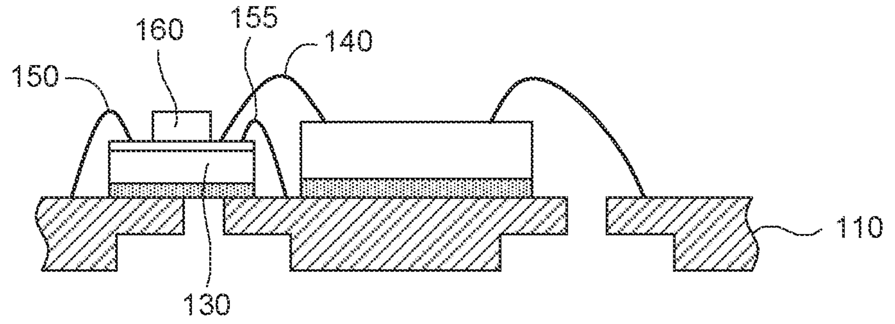
Figure 4C:
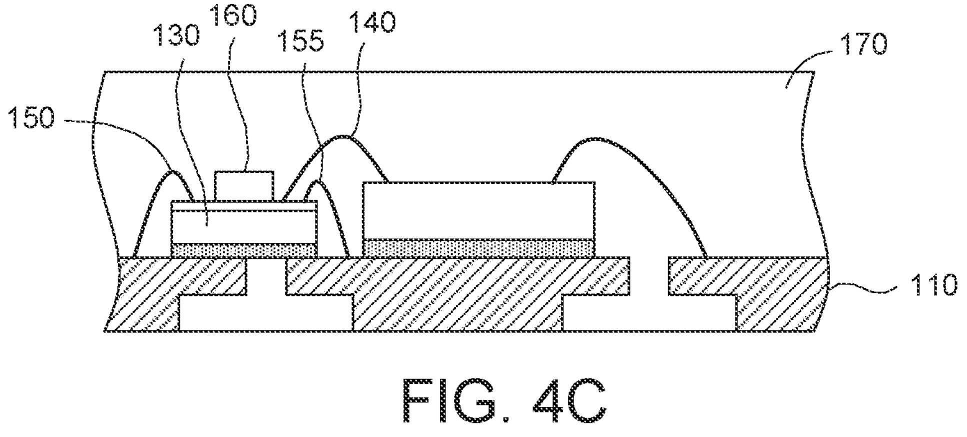

Referring to FIGS. 4A to 4C, FIGS. 4A to 4C illustrate diagram views of manufacturing processes of the semiconductor device 100 of FIG. 1B.

As shown in FIG. 4A, the electronic component 120 and the adapter 130 are disposed on the carrier 110. For example, the electronic component 120 is disposed on the die pad 111 of the carrier 110, and the adapter 130 bridges the die pad 111 and the lead, for example, the inner lead of the lead.

The electronic component 120 could be disposed on the carrier 110 before the adapter 130, or the adapter 130 could be disposed on the carrier 110 before the electronic component 120. In addition, the electronic component 120 could be disposed on the carrier 110 through the first adhesive layer 125, and the adapter 130 could be disposed on the carrier 110 through the second adhesive layer 135.

In addition, the passive element 160 could be disposed over or on the adapter 130. In an embodiment, the adapter 130 could be disposed on the carrier 110 first, and then the passive element 160 is disposed on the adapter 130. Alternatively, the passive element 160 is disposed on the adapter 130 first, and then the whole of the passive element 160 and the adapter 130 is disposed on the carrier 110.

As shown in FIG. 4B, a plurality of metal wires connecting two of the carrier 110, the electronic component 120 and the adapter 130. For example, at least one first metal wire 140 connects the electronic component 120 with the adapter 130, at least one second metal wire 150 connects the adapter 130 with the carrier 110, and at least one third metal wire 155 connects the adapter 130 with the carrier 110.

As shown in FIG. 4C, the package body 170 encapsulating the electronic component 120, the adapter 130, the first metal wires 140, the second metal wires 150 is formed on the carrier 110 by using compression molding, injection molding, or transfer molding.

Then, the structure of FIG. 4C could be singulated to form at least one semiconductor device 100 of FIG. 1B by sawing, cutting, etc.

Referring to FIGS. 5A to 5D, FIGS. 5A to 5D illustrate diagram views of manufacturing processes of the semiconductor device 200 of FIG. 2B.

Figure 5A:
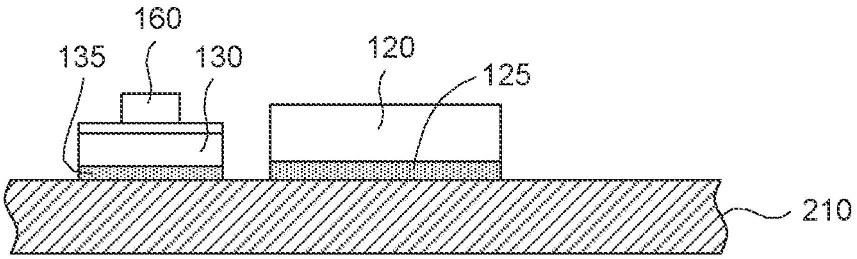
FIGS. 5A to 5D illustrate diagram views of manufacturing processes of the semiconductor device of FIG. 2B.

As shown in FIG. 5A, the electronic component 120 and the adapter 130 are disposed on the carrier 210. The electronic component 120 could be disposed on the carrier 210 before the adapter 130, or the adapter 130 could be disposed on the carrier 210 before the electronic component 120. In addition, the electronic component 120 could be disposed on the carrier 210 through the first adhesive layer 125, and the adapter 130 could be disposed on the carrier 110 through the second adhesive layer 135.

In addition, the passive element 160 could be disposed over/on the adapter 130. In an embodiment, the electronic component 120 could be disposed on the carrier 210 first, and then the passive element 160 is disposed on the adapter 130 which is disposed on the carrier 210. Alternatively, the passive element 160 is disposed on the adapter 130 first, and then the whole of the passive element 160 and the adapter 130 is disposed on the carrier 210.

Figure 5B:
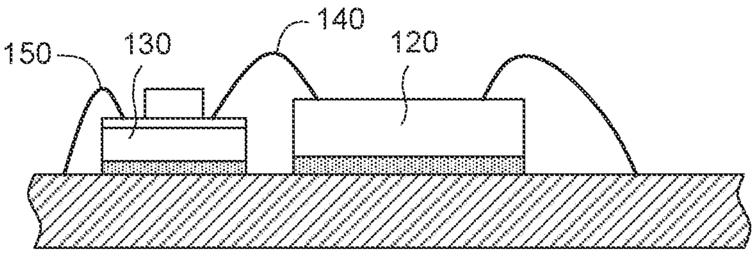

As shown in FIG. 5B, a plurality of metal wires connecting two of the carrier 110, the electronic component 120 and the adapter 130. For example, at least one first metal wire 140 connects the electronic component 120 with the adapter 130, and at least one second metal wire 150 connects the adapter 130 with the carrier 110.

Figure 5C:
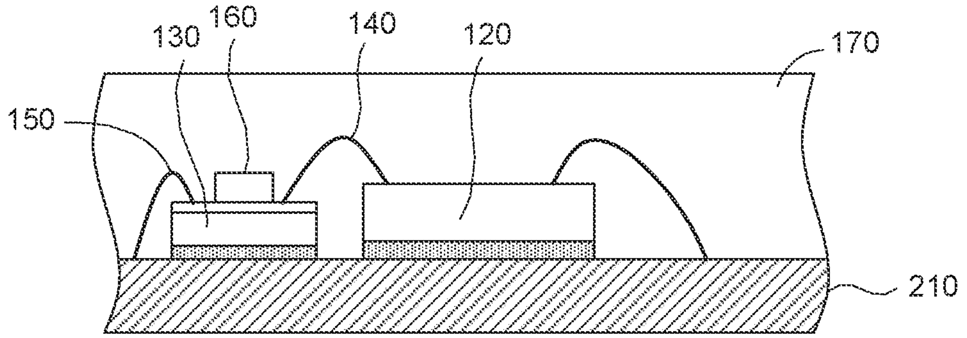

As shown in FIG. 5C, the package body 170 encapsulating the electronic component 120, the adapter 130, the first metal wires 140, the second metal wires 150 is formed on the carrier 110 by using compression molding, injection molding, or transfer molding.

Figure 5D:
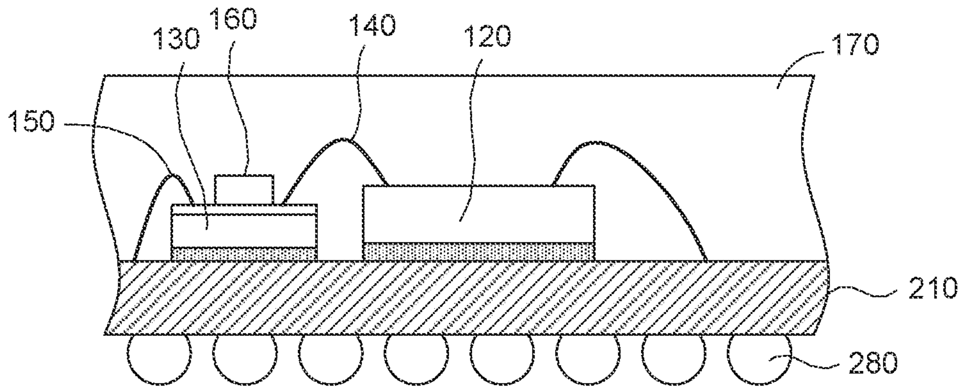

As shown in FIG. 5D, at least one solder ball 280 is formed on a lower surface of the substrate 210.

Then, the structure of FIG. 5D could be singulated to form at least one semiconductor device 200 of FIG. 2B by sawing, cutting, etc.

The manufacturing method for the semiconductor device 300 includes the processes similar to or the same as that of the semiconductor device 100, and the similarities will not repeated here.

To sum up, the semiconductor device and the manufacturing method thereof are provided. The semiconductor device at least includes at least one adapter connecting the carrier with a component, for example, the electronic component and/or the carrier. As a result, it could avoid the electrical shorting of the metal wires in wire bonding process and/or the process of forming the package body.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor device, comprising:

a carrier;

an electronic component disposed on the carrier;

an adapter disposed on the carrier and comprising a redistribution layer (RDL);

a first metal wire connecting the electronic component and the adapter;

a second metal wire connecting the adapter and the carrier; and a passive element disposed over the adapter and in contact with the RDL of the adapter.

2. The semiconductor device as claimed in claim 1, wherein the carrier is a leadframe comprising a die pad and an inner lead separated from the die pad by a gap, the adapter bridges the die pad and the inner lead.

3. The semiconductor device as claimed in claim 1, wherein the carrier is a leadframe comprising a die pad and an outer lead, the electronic component is disposed on the die pad, the second metal wire connects the adapter and the outer lead.

4. The semiconductor device as claimed in claim 1, wherein the carrier is a leadframe comprising a die pad and an inner lead, the electronic component is disposed on the die pad, the semiconductor device further comprises:

a third metal wire connecting the die pad and the adapter.

5. The semiconductor device as claimed in claim 1, wherein the adapter surrounds the electronic component.

6. The semiconductor device as claimed in claim 1, wherein the adapter further comprises a silicon base on which the RDL is formed.

7. The semiconductor device as claimed in claim 1, wherein the adapter does not comprise any active element and passive element.

8. The semiconductor device as claimed in claim 1, wherein the adapter is a substrate.

9. The semiconductor device as claimed in claim 1, further comprising:

a package body encapsulating the electronic component, the adapter, the first metal wire and the second metal wire.

10. A manufacturing method, comprising:

disposing an electronic component on a carrier;

disposing an adapter on the carrier, wherein the adapter comprises a RDL;

disposing a passive element over the adapter, wherein the passive element is in contact with the RDL of the adapter;

connecting the electronic component and the adapter by a first metal wire;

connecting the adapter and the carrier by a second metal wire.

11. The manufacturing method as claimed in claim 10, wherein the carrier is a leadframe comprising a die pad and an inner lead separated from the die pad by a gap; in disposing the adapter on the carrier, the adapter bridges the die pad and the inner lead.

12. The manufacturing method as claimed in claim 10, wherein the carrier is a leadframe comprising a die pad and an outer lead, in disposing the electronic component on the carrier, the electronic component is disposed on the die pad; in connecting the adapter and the carrier by the second metal wire, the second metal wire connects the adapter and the outer lead.

13. The semiconductor manufacturing method as claimed in claim 10, wherein the carrier is a leadframe comprising a die pad and an inner lead; in disposing the electronic component on the carrier, the electronic component is disposed on the die pad; the manufacturing method further comprises:

connecting the die pad and the adapter by a third metal wire.

14. The manufacturing method as claimed in claim 10, wherein in disposing the adapter on the carrier, the adapter surrounds the electronic component.

15. The semiconductor manufacturing method as claimed in claim 10, wherein in disposing the adapter on the carrier, the adapter comprises a silicon base on which the RDL is formed.

16. The semiconductor manufacturing method as claimed in claim 10, wherein the adapter does not comprise any active element and passive element.

17. The semiconductor manufacturing method as claimed in claim 10, wherein the adapter is a substrate.

18. The manufacturing method as claimed in claim 10, further comprising:

forming a package body to encapsulate the electronic component, the adapter, the first metal wire and the second metal wire.

* * * * *